United States Patent
Akimoto

(10) Patent No.: US 7,495,771 B2
(45) Date of Patent: Feb. 24, 2009

(54) EXPOSURE APPARATUS

(75) Inventor: Satoshi Akimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/775,094

(22) Filed: Jul. 9, 2007

(65) Prior Publication Data

US 2008/0013099 A1      Jan. 17, 2008

(30) Foreign Application Priority Data

Jul. 11, 2006   (JP)   ............... 2006-190829

(51) Int. Cl.
    *G01B 11/02*   (2006.01)
(52) U.S. Cl. .............. 356/500; 356/498; 356/508
(58) Field of Classification Search .......... 356/500, 356/490, 508, 509, 498
See application file for complete search history.

(56) References Cited

U.S. PATENT DOCUMENTS 6,400,441 B1 *  6/2002  Nishi et al. .................. 355/53

2006/0187431 A1 *  8/2006  Shibazaki ................. 355/53

FOREIGN PATENT DOCUMENTS

JP   2000-323404 A   11/2000
JP   2001-059704 A   3/2001

* cited by examiner

*Primary Examiner*—Tarifur Chowdhury
*Assistant Examiner*—Michael Lapage
(74) *Attorney, Agent, or Firm*—Canon U.S.A., Inc. I.P. Division

(57) ABSTRACT

In an exposure apparatus having a plurality of substrate stages moving between a plurality of stations, errors due to the combination of the stage and a position measuring unit, such as Abbe error and errors due to the surface configuration of a reflection mirror, are precisely corrected to reduce the position error of the substrate stage. The exposure apparatus includes a control device having a storage unit and a correction unit. The storage unit stores the correction information established every combination of the plurality of substrate stages and a plurality of position measuring units, and the correction unit corrects the result measured by the plurality of position measuring units on the basis of the correction information corresponding to the combination of the substrate stages and the position measuring units among pieces of correction information stored in the storage unit.

6 Claims, 6 Drawing Sheets

EXPOSURE APPARATUS

BACKGROUND OF THE INVENTION

1. Field of the Invention

The present invention relates to an exposure apparatus having a plurality of substrate stages.

2. Description of the Related Art

In a photo-lithographic process for manufacturing semiconductor devices, an exposure apparatus is incorporated for transferring a reticle fine pattern onto a wafer having a photosensitive material coated thereon. An exposure apparatus in the related art includes one wafer stage so that the processes of carrying-in the wafer, alignment measurement, exposure, and carrying-out the wafer are performed in series.

However, for further improving a throughput, a twin-stage exposure apparatus including two wafer stages has been recently adopted. The twin-stage exposure apparatus includes two stations of measurement and exposure. Such a twin-stage exposure apparatus is disclosed in Japanese Patent Laid-Open No. 2000-323404, for example.

The position measurement of the wafer stage relative to the station needs a high accuracy so that the position is measured with a high-resolution laser interferometer and a reflection mirror as a target of its laser light. Each station includes the laser interferometer mounted thereon that can measure the posture of the wafer stage. The value measured by the laser interferometer may include Abbe errors due to the straightness of the laser light axis and measurement errors due to the surface configuration of the reflection mirror. These measurement errors result in the position measurement errors of the wafer stage, thus deteriorating apparatus functions.

In order to reduce such position measurement errors of the wafer stage measured by the interferometer, a correction factor and a table obtained from exposure results in advance are referred to correct the measured value. Such a technique correcting the position measurement errors of the wafer stage is disclosed in Japanese Patent Laid-Open No. 2001-59704, for example. However, the exposure apparatus shown in Japanese Patent Laid-Open No. 2001-59704 includes one wafer stage along with one station, so that the factor and the table are uniquely determined.

In the twin-stage exposure apparatus, two wafer stages reciprocate between two stations. That is, there are four combinations of the stage and the station. Thus, if the correction factor is employed, which has been uniquely established for the position measurement errors of the wafer stage in a case of one wafer stage along with one station, the residual correction error is generated, causing the positional displacement of the wafer stage. Consequently, if the position is displaced along XY-directions, overlapping errors are generated, if along Z-direction, focus errors are generated.

SUMMARY OF THE INVENTION

The present invention has been made in view of such problems and it allows the positional displacement of a substrate stage to be reduced in an exposure apparatus in that a plurality of the substrate stages move between a plurality of stations.

The present invention also allows the manufacturing of highly-integrated devices with a high throughput using the exposure apparatus well-corrected in positional displacement of the substrate stage.

According to a first aspect of the present invention, an exposure apparatus includes a plurality of stations; a plurality of substrate stages, each holding a substrate and being movable between the plurality of stations; a plurality of position measuring units corresponding to the plurality of stations, respectively, for measuring the position of the substrate stage located in the station; and a storage unit configured to store pieces of correction information established every combination of the plurality of substrate stages and the plurality of position measuring units, and a correction unit configured to correct the respective results measured by the plurality of position measuring units on the basis of the correction information corresponding to the combination of the substrate stage and the position measuring unit among the pieces of correction information stored in the storage unit.

According to another aspect of the present invention, the plurality of stations include a measurement station configured to perform advance measurement of the substrate held by one of the two substrate stages, and an exposure station configured to expose the substrate held by the other. Also, the position measuring unit includes an interferometer, and the plurality of substrate stages include reflection mirrors, respectively, each reflection mirror being configured to reflect the measurement light from the interferometer. Furthermore, the pieces of correction information include the information for correcting at least one of Abbe error of the interferometer and the error due to reflection surface configuration of the reflection mirror.

According to yet another aspect of the present invention, a device manufacturing method includes the steps of exposing a substrate with light using the exposure apparatus described above; and developing the substrate.

Further features and aspects of the present invention will become apparent from the following description of exemplary embodiments with reference to the attached drawings.

DESCRIPTION OF THE EMBODIMENTS

Figure 1:
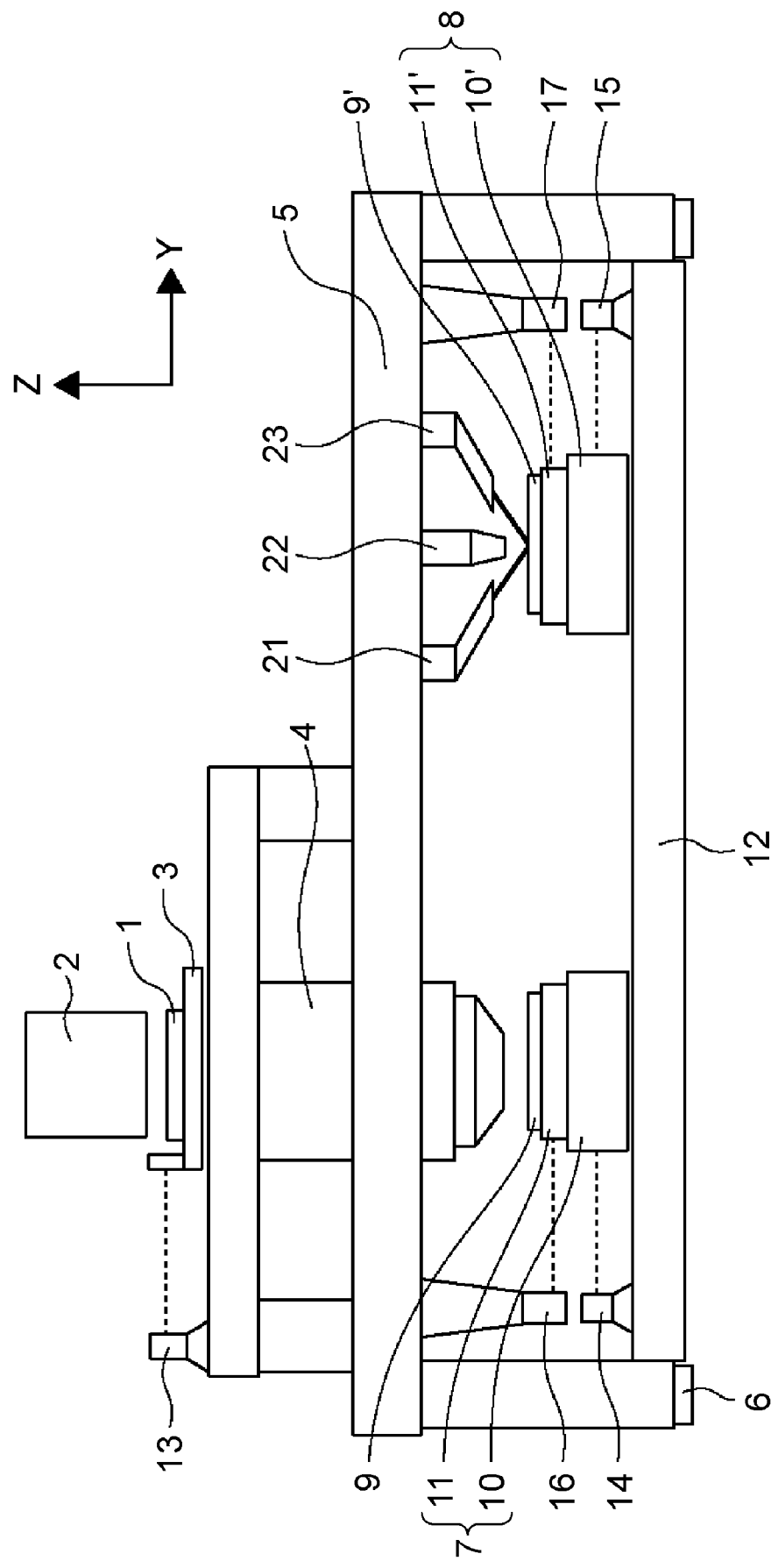
FIG. 1 is a schematic view of an example configuration of a twin-stage exposure apparatus according to an exemplary embodiment of the present invention.

FIG. 1 is a schematic front view of a twin-stage exposure apparatus according to a preferred embodiment of the present invention. A reticle 1 is held by a reticle stage 3 movable in Y-direction and is illuminated with an illumination unit 2. A pattern formed on the reticle 1 is projected onto a wafer (substrate) 9 by a projection lens (projection optical system) 4 supported to a lens barrel support body 5. An active mount 6 supports the lens barrel support body 5 for suppressing vibration as well as isolating the vibration from the floor for an apparatus body (the lens barrel support body).

A stage base 12 supports a first wafer stage (a first substrate stage) 7 and a second wafer stage (a second substrate stage) 8. First, the first wafer stage 7 will be described. The first wafer stage 7 includes a coarse-motion stage 10 movable in XY-directions and a fine-motion stage 11 movable relative to the coarse-motion stage 10 in 6-axial directions X, Y, Z, ωX, ωY, and ωZ by an actuator (not shown). Similarly, the second wafer stage 8 includes a coarse-motion stage 10' and a fine-motion stage 11'. The fine-motion stages 11 and 11' can mount wafers 9 and 9' thereon, respectively. It is noted that the coarse-motion stages 10 and 10' rise above the stage base 12 with air, and are freely movable in the XY-plane.

For measuring the relative position in Y-direction and the postures in the directions ωX and ωZ of the lens barrel support body 5 and the reticle stage 3, a laser interferometer 13 is provided. Similarly, for measuring those in the directions X, Z, and ωY, a laser interferometer (not shown) is provided.

For measuring the relative position in Y-direction of the stage base 12 and the coarse-motion stage 10, a laser interferometer 14 is provided. Similarly, for measuring that in X-direction, a laser interferometer (not shown) is provided. Also, for measuring the relative position in Y-direction of the stage base 12 and the coarse-motion stage 10', a laser interferometer 15 is provided. Similarly, for measuring that in X-direction, a laser interferometer (not shown) is provided. For measuring the relative position in Y-direction and the postures in the direction ωX of the lens barrel support body 5 and the fine-motion stage 11, a laser interferometer 16 is provided. Similarly, for measuring those in the directions X, Z, ωY, and ωZ, a laser interferometer (not shown) is provided. Also, for measuring the relative position in Y-direction and the postures in the direction ωX of the lens barrel support body 5 and the fine-motion stage 11', a laser interferometer 17 is provided. Similarly, for measuring those in the directions X, Z, ωY, and ωZ, a laser interferometer (not shown) is provided. It is noted that the aforementioned laser interferometers 13 to 17 are used for measuring the positions of the first and second wafer stages 7 and 8.

The twin-stage exposure apparatus includes an exposure station and a measurement station. The exposure station corresponds to the left-half part of FIG. 1, and exposes the reticle pattern onto the wafer 9. On the other hand, the measurement station corresponds to the right-half part of FIG. 1, and performs advance measurements such as alignment measurement and focus leveling measurement. In FIG. 1, the first wafer stage 7 is positioned in the exposure station and the second wafer stage 8 in the measurement station. However, the first and second wafer stages 7 and 8 counterchange with each other in position of the station by the movement of the coarse-motion stages 10 and 10'.

The measurement station is provided with an alignment scope 22 for measuring alignment of the wafer 9' to be exposed. The alignment scope 22 measures an alignment mark marked on the wafer 9'. The measurement station is also provided with a grazing incidence focus leveling sensor for measuring focus leveling of the wafer 9'. This sensor mainly includes a light source (not shown), a projection objective lens 21, a light-receiving objective lens 23, and a photo detector (not shown). The grazing incidence focus leveling sensor measures the surface configuration of the wafer 9'.

In the exposure station, the exposure is performed while the reticle stage 3 having the reticle 1 mounted thereon is synchronized with the first wafer stage 7 (the coarse-motion stage 10 and the fine-motion stage 11) having the wafer 9 mounted thereon.

Figure 2:
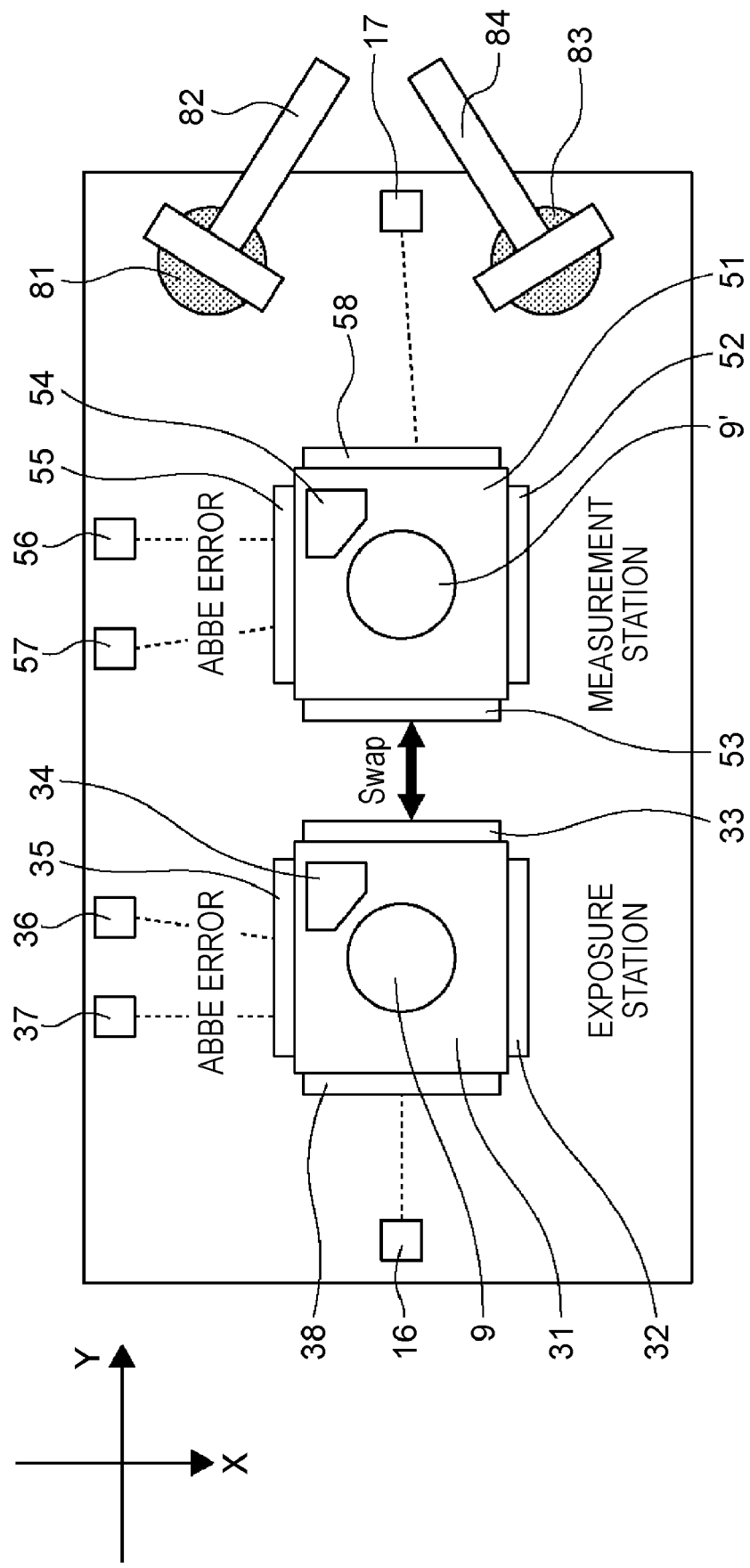
FIG. 2 is a schematic view of an example configuration of a fine-motion stage and an interferometer according to the embodiment of the present invention.

FIG. 2 is a schematic view of the arrangement of the fine-motion stages 11 and 11' and the interferometers 16, 17, 36, 37, 56, and 57 viewed from Z-direction. First, the fine-motion stage 11 will be described. The wafer 9 is supported on a top plate 31 with a chuck (not shown). A measurement plate 34 is mounted on the top plate 31. On the measurement plate 34, an illumination photometer and a reference mark are mounted for calibration.

On all sides of the top plate 31 of the fine-motion stage 11 (shown in FIG. 1), reflection mirrors 32, 33, 35, and 38 are mounted for reflecting the measurement light of the laser interferometers. The fine-motion stage 11 is located in the exposure station in the drawing, and the measurement light of the laser interferometers 36 and 37 is projected onto the reflection mirror 35 while the measurement light of the laser interferometer 16 is projected onto the reflection mirror 38.

As described above, the fine-motion stages 11 and 11' are counter-changeable with each other between the exposure station and the measurement station. When the fine-motion stage 11 is located in the measurement station, the measurement light of the laser interferometers 56 and 57 is projected onto the reflection mirror 35, and the measurement light of the laser interferometer 17 is projected onto the reflection mirror 33. Namely, every time the fine-motion stage 11 counterchanges the station, the reflection mirrors are switched for reflecting the measurement light from the laser interferometers.

Next, the fine-motion stage 11' will be described. The wafer 9' is supported on a top plate 51 with a chuck (not shown). A measurement plate 54 is mounted on the top plate 51. On the measurement plate 54, an illumination photometer and a reference mark are mounted for calibration.

On all sides of the top plate 51 of the fine-motion stage 11', reflection mirrors 52, 53, 55, and 58 are mounted for reflecting the measurement light of the laser interferometers. The fine-motion stage 11' is located in the measurement station in the drawing, and the measurement light of the laser interferometers 56 and 57 is projected onto the reflection mirror 55 while the measurement light of the laser interferometer 17 is projected onto the reflection mirror 58. When the fine-motion stage 11' is moved to the exposure station, the measurement light of the laser interferometers 36 and 37 is projected onto the reflection mirror 55, and the measurement light of the laser interferometer 16 is projected onto the reflection mirror 53. Every time the fine-motion stage 11' also counterchanges the station, the reflection mirrors are switched for reflecting the measurement light from the laser interferometers.

A carry-in device 82 takes in the wafer for exposure and a carry-out device 84 carries out the wafer finished the exposure. The carry-in device 82 transfers the wafer to the wafer stage located in the measurement station at a carry-in position 81. The carry-out device 84 recovers the wafer from the wafer stage located in the measurement station at a carry-out position 83.

Figure 3:
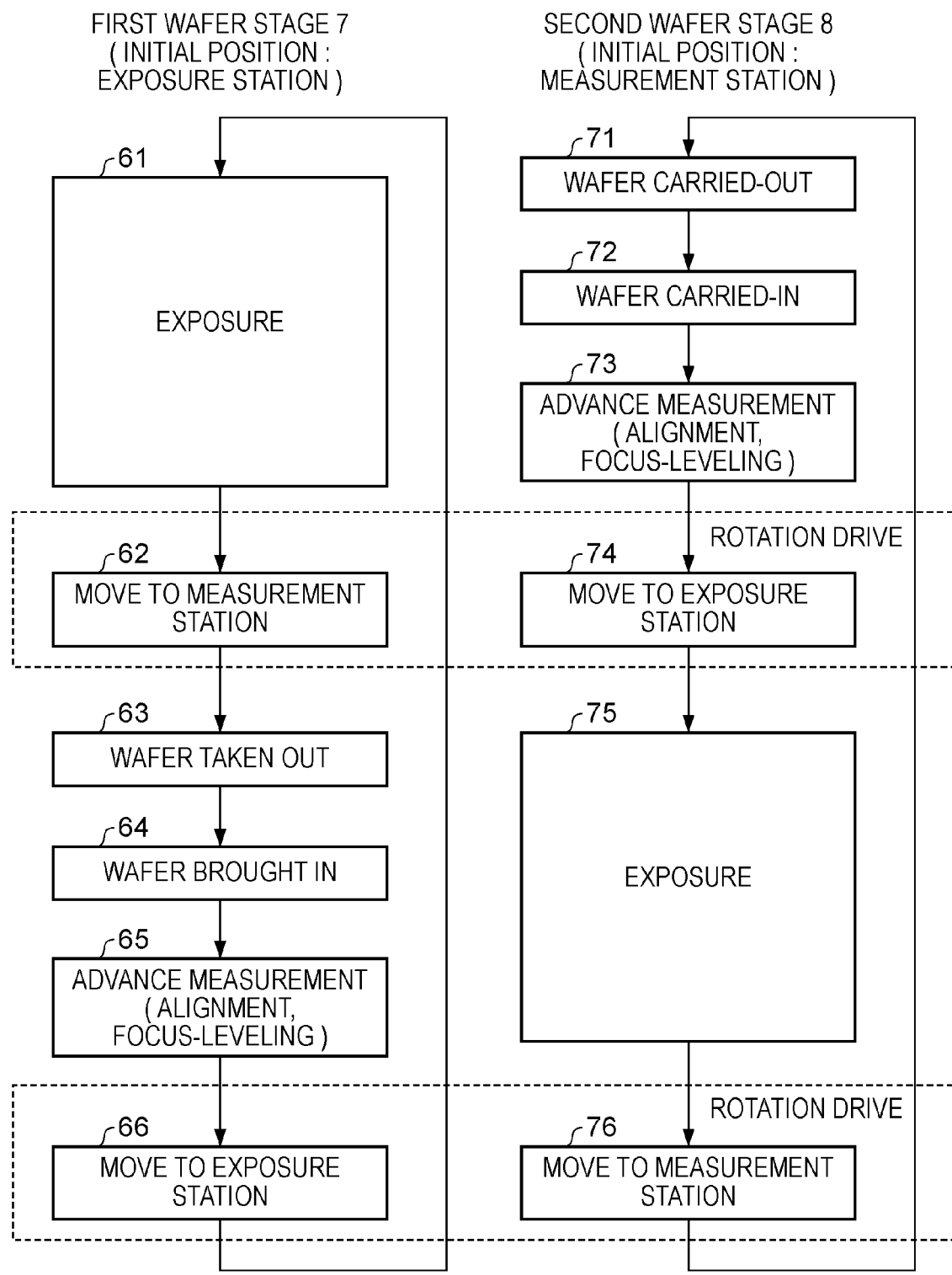
FIG. 3 is a schematic flowchart of the exposure process of the twin-stage exposure apparatus according to the embodiment of the present invention.

FIG. 3 is a schematic flowchart of the exposure process of the twin-stage exposure apparatus. Upon describing, the initial state is assumed that the first wafer stage 7 be located at the exposure station and the second wafer stage 8 at the measurement station, for convenience sake. These initial positions may be obviously reversed to each other. Both the wafer stages 7 and 8 are to have no wafer mounted thereon.

First, the second wafer stage 8 starts carrying-in a wafer at step 72. Then, at step 73, advance measurement is performed for obtaining the information necessary for exposure such as alignment measurement and focus leveling measurement. On the other hand, while the second wafer stage 8 is performing steps 72 and 73, the first wafer stage 7 is put on standby because the first wafer stage 7 does not mount a wafer thereon only at the initial time. If a wafer is mounted on the first wafer stage 7, the exposure is performed meanwhile. Upon finishing the advance measurement by the second wafer stage 8, the rotation is driven so that the second wafer stage 8 is moved to the exposure station (step 74) and the first wafer stage 7 is moved to the measurement station (step 62). Then, the second wafer stage 8 executes the exposure at step 75 on the basis of results from the advance measurement at step 73. Meanwhile, the first wafer stage 7 sequentially performs carrying-out the exposed wafer (not at the initial time) at step 63, carrying-in a wafer at step 64, and the advance measurement at step 65. Upon finishing both the steps 65 and 75, the rotation is driven so that the first wafer stage 7 is moved to the exposure station (step 66) and the second wafer stage 8 is moved to the measurement station (step 76). Then, the first wafer stage 7 continues to do exposure at step 61 and the second wafer stage 8 continues carrying-out the wafer at step 71. Thereafter, the second wafer 8 stage executes the advance measurement while the first wafer stage 7 executes the exposure by driving for swapping (step 61).

The laser interferometer herein includes the shift component and the inclination component of the light axis due to the processing accuracies of its own optical parts and mechanical parts and assemble errors so as to generate Abbe error. Also, the reflection mirror includes the plane waviness in the order of sub-microns due to the similar factors so as to generate the flatness error of the reflection mirror.

The information regarding to Abbe error and the flatness error of the reflection mirror is obtained from exposure results to wafers and a sensor in advance so as to store it in a storage unit of a control device as coefficients and tables.

Figure 4:
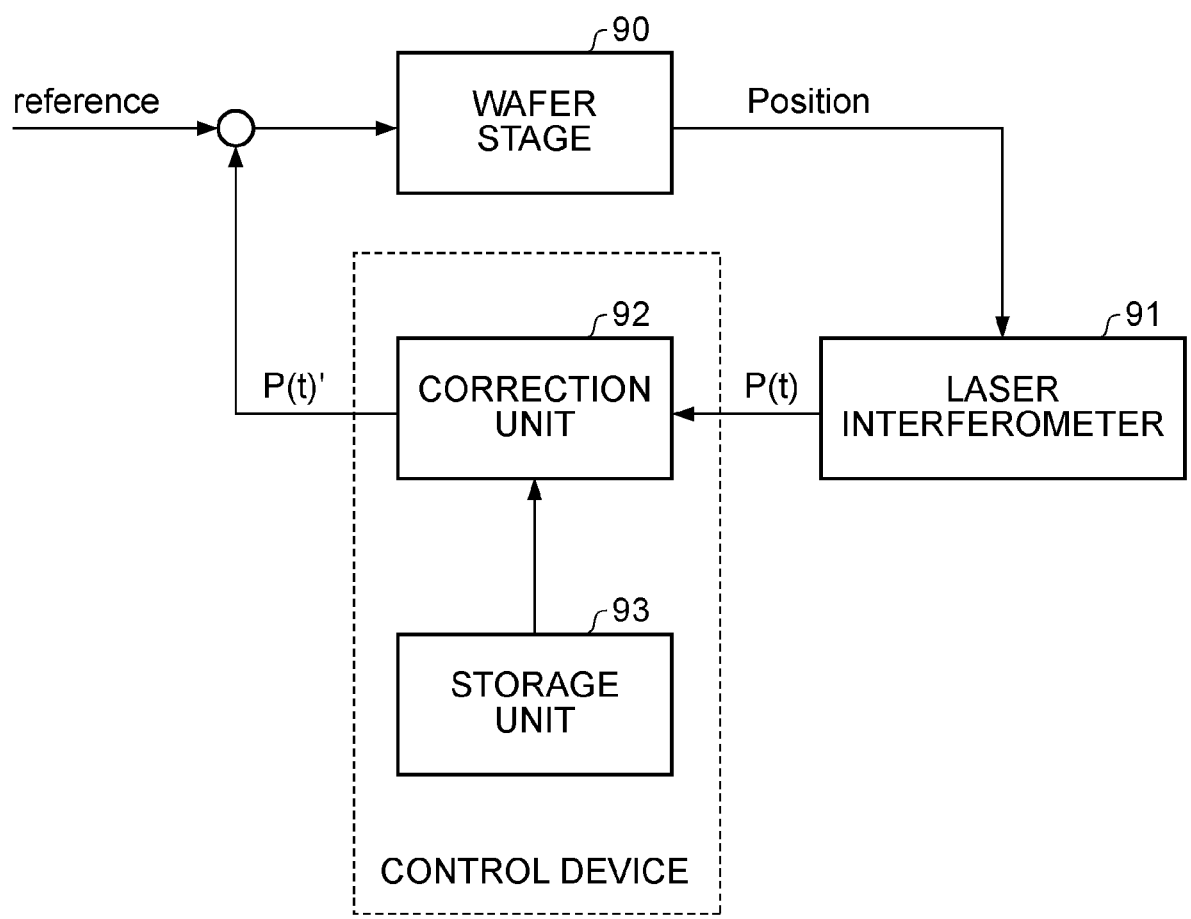
FIG. 4 is a block diagram showing an example correction method of the positional displacement errors in a single-stage exposure apparatus in the related art.

FIG. 4 is a block diagram illustrating a correction method of Abbe error and the flatness error of the reflection mirror in a single-stage exposure apparatus. The result of measuring the position ("position" in the drawing) of a wafer stage 90 by a laser interferometer 91 is P(t) (t: time). The above-mentioned Abbe error and the flatness error of the reflection mirror are included in P(t). Then, the positional measurement error is corrected in a correction unit 92. At this time, the correction is executed using the correction coefficients and correction tables stored in a correction information storage unit 93 in advance. For description convenience sake, when the correction by the correction unit 92 is summarize as fcorrect( ), the corrected wafer stage position P(t)' can be expressed by the following equation:

$$P(t)'=fcorrect(P(t)) \quad (1).$$

Furthermore, the position error is calculated from the difference between the target position "reference" and the corrected position P(t)', and the wafer stage 90 is driven so as to cancel the calculated position error.

Whereas, in the twin-stage exposure apparatus according to the embodiment of the present invention, the exposure process is executed while the first wafer stage 7 and the second wafer stage 8 counterchange with each other between the exposure station and the measurement station. In such a case, as described with reference to FIG. 2, the combination of the laser interferometer and the reflection mirror is changed.

The laser interferometers 16, 36, and 37 in the exposure station herein are designated as a first interferometer system 101 and the laser interferometers 17, 56, and 57 in the measurement station are designated as a second interferometer system 106. Thereby, between the wafer stage and the interferometer system, 4 combinations exit as follows:

(1) the first wafer stage 7 and the first interferometer system 101;
(2) the second wafer stage 8 and the second interferometer system 106;
(3) the first wafer stage 7 and the second interferometer system 106;
(4) the second wafer stage 8 and the first interferometer system 101.

Since the position where the beam spot of the laser interferometer impinges on the reflection mirror is changed due to the combination of the laser interferometer and the reflection mirror, Abbe error and the flatness error of the reflection mirror also differ with the 4 combinations (1) to (4).

Figure 5:
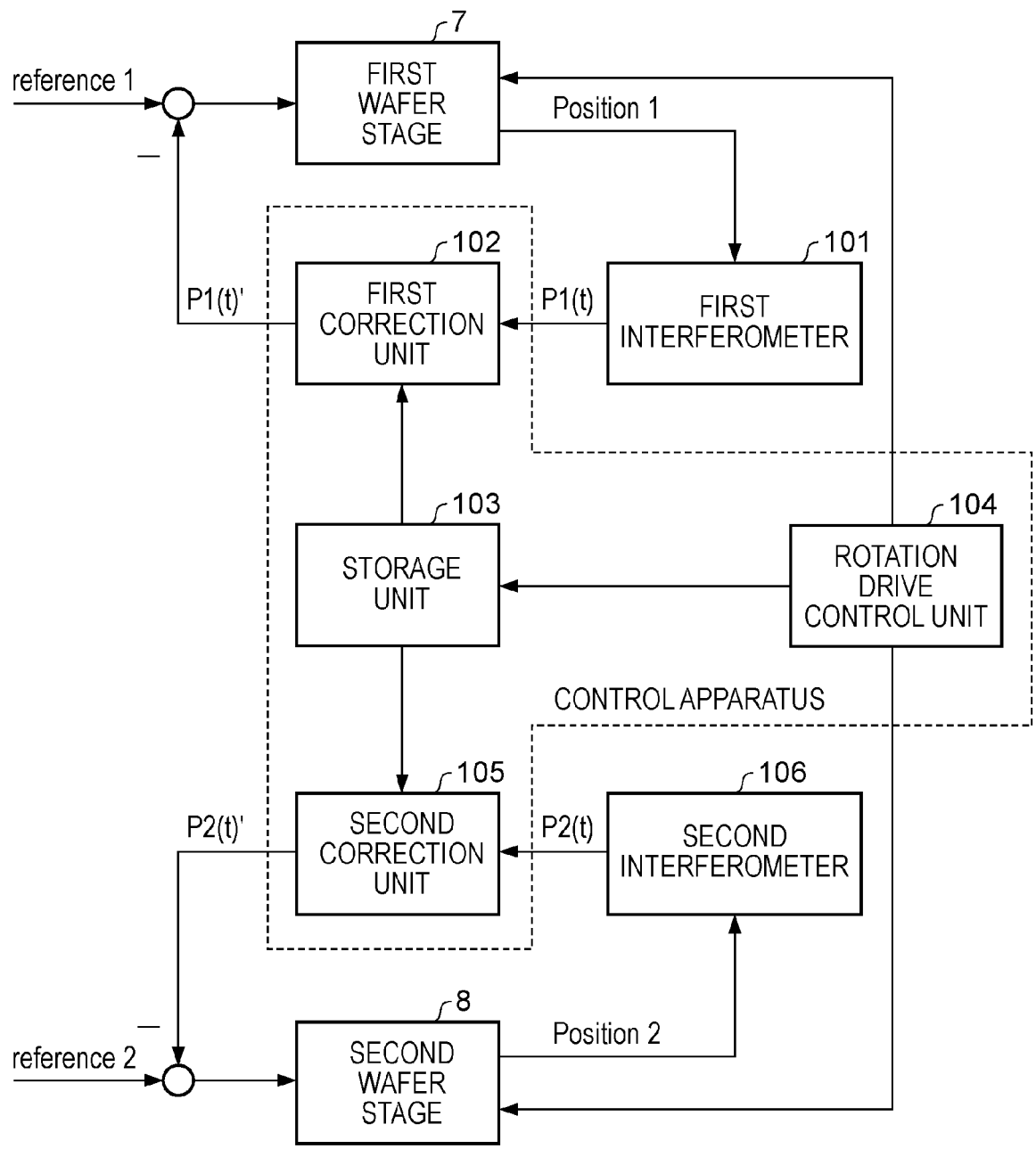
FIG. 5 is a block diagram showing an example correction method of the positional displacement errors in the twin-stage exposure apparatus according to the embodiment of the present invention.

FIG. 5 is a block diagram illustrating a correction method of Abbe error and the flatness error of the reflection mirror in a twin-stage exposure apparatus. A control device includes a wafer-stage rotation drive control unit 104, a storage unit 103 for storing the correction information established every combination of the wafer stage and the interferometer, and correction units 102 and 105 for correcting the result measured by the interferometer based on the correction information.

The first wafer stage 7 and the second wafer stage 8 are rotation driven by the rotation drive control unit 104 between the first interferometer system 101 and the second interferometer system 106. The result of measuring the position ("position 1" in the drawing) of the first wafer stage 7 by the first interferometer system 101 is P1(t). The rotation drive control unit 104 informs the storage unit 103 of the correction information that at which interferometer system, the two stages are positioned, i.e., which combination of the above-mentioned combinations (1) to (4). The storage unit 103 feeds the suitable correction information to the first correction unit 102 based on this information. When the correction by the first correction unit 102 is summarize as fcorrect1( ), the corrected wafer stage position P1(t)' can be expressed by the following equation:

$$P1(t)'=fcorrect1(P1(t)) \quad (2).$$

Furthermore, the position error is calculated from the difference between the target position "reference1" and the corrected position P1(t)', and the first wafer stage 7 is driven so as to cancel the calculated position error.

Similarly, the second correction unit 105 corrects P2(t) measured by the second interferometer system 106 as the following equation, using correction fcorrect2 ( ) fed from the storage unit 103 of the correction information:

$$P2(t)'=fcorrect2(P2(t)) \quad (3).$$

Furthermore, the position error is calculated from the difference between the target position "reference2" and the corrected position P2(t)', and the second wafer stage 8 is driven so as to cancel the calculated position error.

As described above, by switching the correction information in accordance with the combination of the wafer stage and the interferometer system, the position error of the wafer stage can be suppressed.

According to the embodiment, the correction of the fine-motion stage has been described; alternatively, the coarse-motion stage may also be incorporated. Specifically, the correction information is switched due to the combination of the laser interferometers 14 and 15 and the coarse-motion stages 10 and 10' shown in FIG. 1.

According to the embodiment, Abbe error and the flatness error of the reflection mirror have been described as correction items of the positional measurement error; however, other correction items depending on the wafer stage, the interferometer system, and the station may be incorporated. For example, the coarse-motion stages 10 and 10' generate errors at Z-position due to the flatness error of the stage base 12 shown in FIG. 1 so as to generate mechanical gaps to the fine-motion stages 11 and 11'. Then, the correction of the flatness error of the stage base 12 with the combination of the stage and the station becomes effective.

According to the embodiment, the two wafer stages and the two interferometer systems (stations) have been exemplified; alternatively, three or more wafer stages and three or more interferometer systems (stations) may also incorporate the invention. This is the same to a case of a plurality of reticle stages and a plurality of interferometer systems on the reticle stage side.

Even in a liquid-immersion exposure apparatus in that the space between a projection lens and a wafer is immersed with liquid, a case of a plurality of stages and a plurality of stations may be incorporated to the invention. Furthermore, measuring equipment other than the interferometer may be used for measuring the wafer stage position.

[Examples of Device Manufacturing Method]

Figure 6:
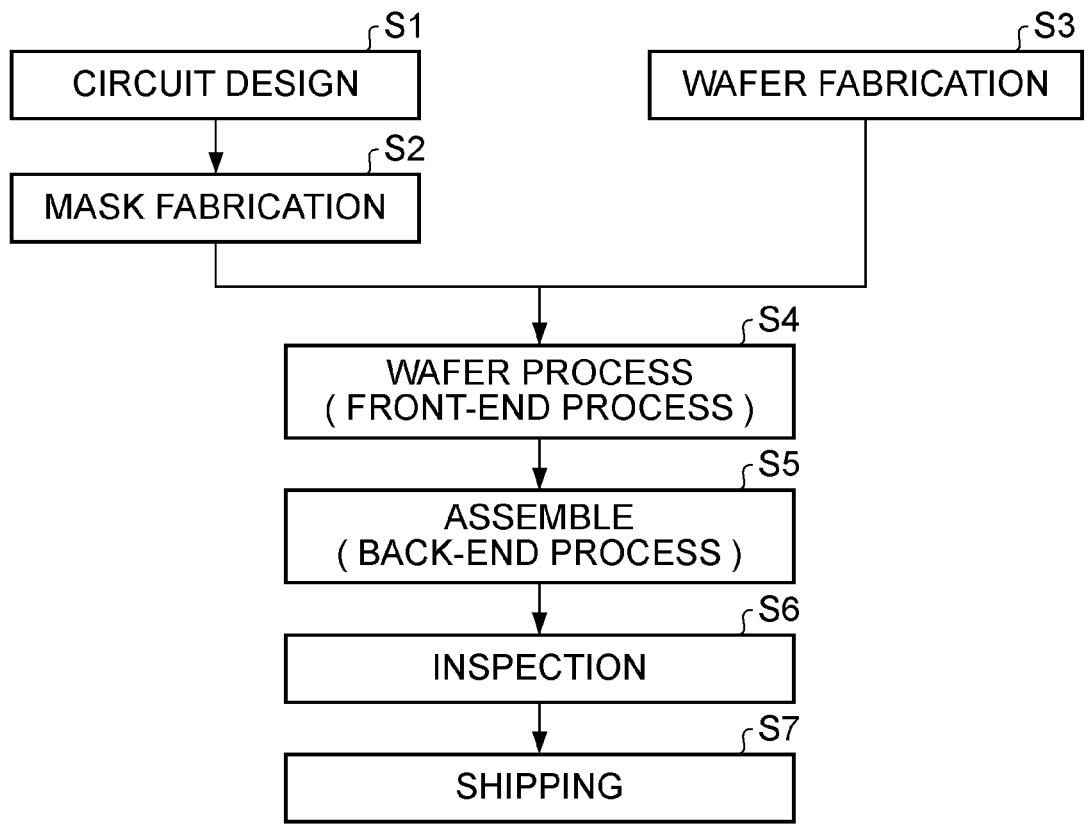
FIG. 6 is a flowchart illustrating example manufacturing devices using the exposure apparatus.

Next, examples of a device manufacturing method using the exposure apparatus described above will be described with reference to FIGS. 6 and 7. FIG. 6 is a flowchart illustrating the manufacturing devices (semiconductor chips, such as ICs and LSIs, LCDs, and CCD sensors) using the exposure apparatus. The manufacturing method herein will be described by exemplifying that for the semiconductor chips.

At step S1 (circuit design), the circuit of the semiconductor chips is designed. At step S2 (mask fabrication), a mask is fabricated based on the designed circuit pattern. At step S3 (wafer fabrication), a wafer is fabricated using a material such as silicon. The step S4 (wafer process) is called a front-end process and forms an actual circuit with the mask and the wafer on the wafer by the exposure apparatus using a lithographic technique. The step S5 (assemble) is called a back-end process including an assemble process, such as assembly steps (dicing and bonding) and a packaging step (chip inclusion), and makes the semiconductor chips using the wafer fabricated at step S4. At step S6 (inspection), inspections are performed, such as checking operations and proof testing of the semiconductor devices fabricated at step S5. After these processes, the semiconductor devices are completed and shipped (step S7).

Figure 7:
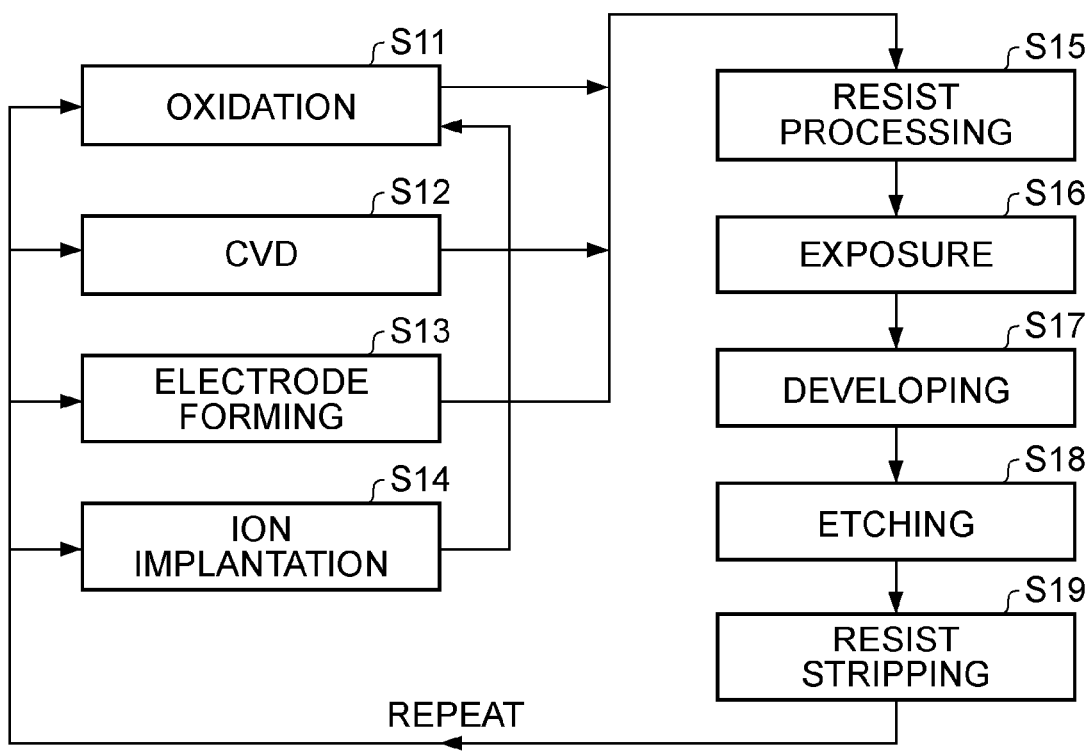
FIG. 7 is a detailed flowchart of the wafer process at step 4 of the flowchart of FIG. 6.

FIG. 7 is a detailed flowchart of the wafer process at step 4 of the flowchart. At step S11 (oxidation), the surface of the wafer is oxidized. At step S12 (CVD), an insulation film is formed on the surface of the wafer. At step S13 (electrode forming), an electrode is formed on the wafer by vapor deposition. At step S14 (ion implantation), an ion is implanted into the wafer. At step S15 (resist processing), the wafer is coated with a photosensitive material. At step S16 (exposure), the circuit pattern of the mask is exposed onto the wafer by the exposure apparatus described above. At step S17 (developing), the exposed wafer is developed. At step S18 (etching), parts other than developed resist images are chipped off. At step S19 (resist stripping), unnecessary resist finished the etching is removed. By repeating these steps, a multiply-layered circuit pattern is formed on the wafer. According to the example of the device manufacturing method, highly integrated semiconductor devices can be manufactured with high accuracies.

According to the exemplary embodiments of the present invention, in the exposure apparatus in that a plurality of substrate stages move between a plurality of stations, the position error of the substrate stage can be reduced.

According to the exemplary embodiments of the present invention, highly integrated devices can be manufactured with a high throughput using the exposure apparatus corrected in position error of the substrate stage.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-190829 filed Jul. 11, 2006, which is hereby incorporated by reference herein in its entirety.

What is claimed is:

1. An exposure apparatus comprising:
   a plurality of stations;
   a plurality of substrate stages, each including reflection mirrors;
   a plurality of interferometers corresponding to the plurality of stations, respectively, for causing the reflection mirrors included in the substrate stage located in the station to reflect a measurement light and measuring the position of the substrate stage;
   a storage unit configured to store pieces of correction information established for every combination of the plurality of interferometers and the plurality of reflection mirrors, for correcting a measurement error caused by at least one of the interferometers or the reflection mirrors; and
   a correction unit configured to correct the respective results measured by the plurality of interferometers on the basis of the correction information corresponding to the combination of the reflection mirror and the interferometer among the pieces of correction information stored in the storage unit;
   wherein the stages are controlled on the basis of a output of the correction unit.

2. The apparatus according to claim 1, wherein the plurality of stations include a measurement station configured to perform advance measurement of the substrate held by one of the two substrate stages and an exposure station configured to expose the substrate held by the other.

3. The apparatus according to claim 1, wherein the pieces of correction information include the information for correcting at least one of Abbe error of the interferometer and the error due to reflection surface configuration of the reflection mirror.

4. The apparatus according to claim 2, wherein the plurality of substrate stages include the reflection mirrors, respectively, the reflection mirrors being arranged on an exposure station side and a measurement station side,
   wherein the reflection mirror on the exposure station side, of the two reflection mirrors, reflects a light so as to measure a position of the substrate stage located in the exposure station, and
   wherein the reflection mirror on the measurement station side, of the two reflection mirrors, reflects a light so as to measure a position of the substrate located in the measurement station.

5. The apparatus according to claim 1, wherein the plurality of substrate stages are movable between the plurality of stations along a first plane, and the position measuring unit is configured to measure the position of the substrate stage in directions at least along the first plane.

6. A device manufacturing method performed with an exposure apparatus, the exposure apparatus including,
   a plurality of stations;
   a plurality of substrate stages, each including reflection mirrors;

a plurality of interferometers corresponding to the plurality of stations, respectively, for causing the reflection mirror included in the substrate stage located in the station to reflect a measurement light and measuring the position of the substrate stage;

a storage unit configured to store pieces of correction information established for every combination of the plurality of interferometers and the plurality of reflection mirrors, for correcting a measurement error caused by at least one of the interferometers or the reflection mirrors; and a correction unit configured to correct the respective results measured by the plurality of interferometers on the basis of the correction information corresponding to the combination of the reflection mirror and the interferometer among the pieces of correction information stored in the storage unit;

wherein the stages are controlled on the basis of a output of the correction unit, the method comprising:

exposing a substrate with light using the exposure apparatus; and developing the substrate.

* * * * *